United States Patent [19]

Astfalk et al.

[11] 4,351,030

[45] Sep. 21, 1982

[54] AUTOMATIC REPAIR APPARATUS AND METHOD FOR INSULATED WIRE

[75] Inventors: Gregory Astfalk, Bristol Township, Bucks County, Pa.; Lawrence A. Fowler, Washington Township, Mercer County, N.J.; Chauncey Herring, Jr., Ewing Township, Mercer County, N.J.; Thaddeus J. Szymczak, Edison, N.J.

[73] Assignee: Western Electric Company, Inc., New York, N.Y.

[21] Appl. No.: 185,067

[22] Filed: Sep. 8, 1980

[51] Int. Cl.³ .......................................... G01R 31/14
[52] U.S. Cl. .................................... 364/552; 364/507; 364/469; 364/483; 118/674; 427/178
[58] Field of Search ............... 364/552, 507, 562, 469, 364/473, 481, 483; 324/54, 238; 356/430; 250/571, 572; 118/712, 670, 674; 427/178

[56] References Cited

U.S. PATENT DOCUMENTS

| | | | |
|---|---|---|---|
| 3,378,676 | 4/1968 | Clement | 118/674 X |
| 3,600,562 | 8/1971 | DiNicolantonio et al. | 364/562 |
| 3,871,212 | 3/1975 | Neugroschl | 356/430 X |
| 3,885,232 | 5/1975 | Goto | 364/507 X |
| 3,903,327 | 9/1975 | Hajagos et al. | 427/178 X |
| 4,042,724 | 8/1977 | Nawracaj | 118/670 X |
| 4,051,722 | 10/1977 | Feller | 364/552 X |
| 4,135,006 | 1/1979 | Readal et al. | 427/10 |
| 4,152,053 | 5/1979 | Menary | 356/430 X |
| 4,156,748 | 5/1979 | King | 427/178 X |
| 4,195,345 | 3/1980 | Artzt et al. | 364/552 X |
| 4,313,085 | 1/1982 | Balchunas | 324/54 |

Primary Examiner—Edward J. Wise
Attorney, Agent, or Firm—Joel F. Spivak

[57] ABSTRACT

A method for repairing faults or defects in the insulation of insulated wire is disclosed together with an apparatus for operation of the method. The method comprises passing insulated wire to be tested for insulation faults at high speed through a fault detector. This fault detector senses the presence of a fault or defect in the wire insulation. Upon sensing a fault, the speed of the wire passing through the apparatus is considerably slowed and the area having the fault is passed through a second fault detector which locate the essentially exact spot of the fault. Thereafter, the wire is automatically moved at the slowed speed through various repair stations where a plastisol coating is applied to the fault, spread evenly over the fault area, cured and then cooled. The cured plastisol repairs the fault and the wire can then proceed at high speed through the apparatus until another fault is detected.

16 Claims, 10 Drawing Figures

4,351,030

AUTOMATIC REPAIR APPARATUS AND METHOD FOR INSULATED WIRE

TECHNICAL FIELD

This invention relates to a machine and method for detecting and repairing faults or defects in insulated wire, such as PVC coated wire.

BACKGROUND OF THE INVENTION

Under present wire manufacturing procedures it has been more economical to scrap large quantities of PVC coated wire when insulation faults are detected than to save the wire, locate the points of fault and repair the defective regions. If an automatic apparatus which could detect, locate and repair and preferably retest faults in such wire were available, it would become economical to make use of wire which would normally be scrapped.

Fault detectors for PVC insulated wire are known and are presently used in the manufacture of PVC wire. One such fault detector is known as a bead-chain fault detector. This detector is a high voltage spark detector wherein the wire to be tested is drawn through a bed containing a multiplicity of small metal beads hanging on metal chains to form a bead curtain in a metal enclosure. The beads and enclosure are held at a given DC potential, typically several thousand volts, while the wire to be tested is held at ground potential. If wire having an insulation fault passes through the detector a current path is formed between the beads and the wire conductor at the fault. Control circuitry associated with the detector detects the current flow, triggering the detector to record the presence of a fault. In past practice, this detector has only been used to indicate the presence or absence of a fault. At the high line speed at which wire is processed, typically about 3,000 ft. per minute, the time required to slow down and/or stop the wire may allow many feet of additional wire to pass through the detector. The stopping time may vary considerably due to the difference in inertia between full and empty wire take-up reels. Consequently the substantially exact location of the fault was not known. We have developed a machine which, after detecting the presence of a fault based upon the prior art method, is then capable of automatically locating, repairing and preferably retesting the fault such that an entire reel of wire can be used without any waste.

SUMMARY OF THE INVENTION

A machine for detecting and repairing insulation faults in insulated wire comprises: means for conveying the wire through the machine; a first fault detector through which the wire passes for sensing the presence of a fault; a second fault detector through which the wire passes which is spaced from the first fault detector specifically locates the region of a fault, the presence of which was detected by said first fault detector; a sequence of fault repair means serially activated after location of the fault and spaced at fixed distances from the second fault detector for applying and curing a fault repair coating over the wire in the region of the fault; and control means responsive to the detection of a fault for controlling the movement and speed of the wire and activation of repair means as it progresses through the machine. Generally, the method for detecting and repairing insulation faults in insulated wire may be summarized as follows: passing the wire at relatively high speeds through a first fault detector for sensing the presence of a fault over a general area of the wire; upon sensing a fault, stopping the wire and reversing its direction at a relatively slow speed through a second fault detector which is either always activated or preferably which is activated after the detection of a fault, this second fault detector specifically locates the region having the fault; sequentially moving the wire fixed distances from the second fault detector in response to a signal from the second fault detector to movement control means such that the fault is sequentially juxtaposed to a series of repair stations for applying and curing a repair coating over the defect and then, preferably, again passing the repaired wire through a fault detector to insure integrity of the repair and finally continuing to test the remainder of the wire at high speed until another fault is detected by the first fault detector whereupon the cycle is repeated.

DETAILED DESCRIPTION

Figure 1:
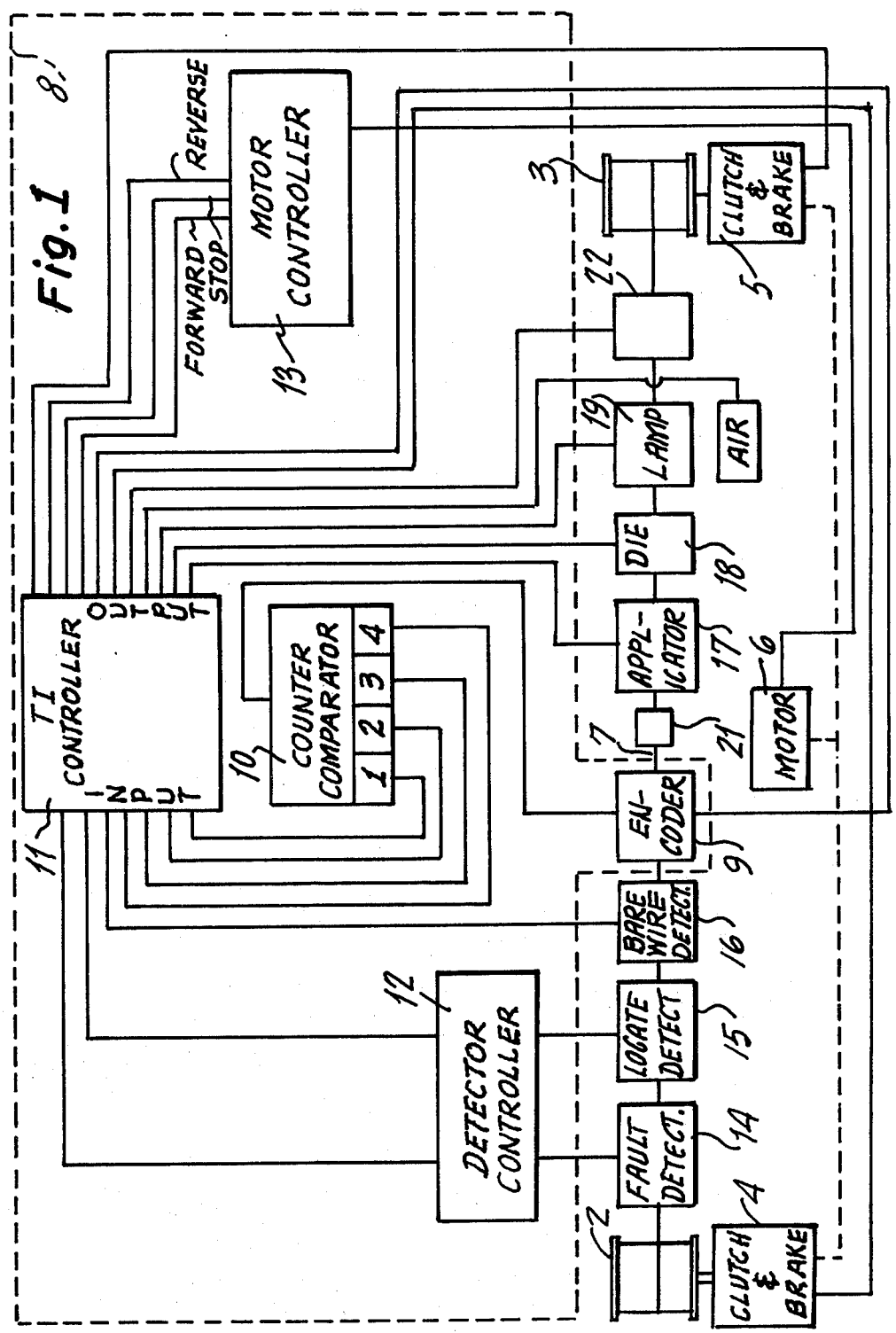
FIG. 1 is a block diagram showing the integral parts of the novel apparatus.

Referring to FIG. 1 there is shown a block diagram of the component parts of an embodiment of the novel machine. The machine 1 comprises an insulated wire supply reel 2 and take-up reel 3, each reel having associated therewith a clutch/brake mechanism 4 and 5, respectively. The clutch/brake mechanisms 4 and 5 together with a motor 6 which are coupled to the clutch/brake mechanisms 4 and 5 by a chain drive, control the speed, direction, and movement of insulated wire 7 through the machine 1 via an electronic control network 8 coupled thereto. The electronic control network 8 comprises an encoder 9, a counter/comparator 10, a process controller 11, a detector controller 12 and a motor controller 13. The detector controller 12 receives signals from a first fault detector 14 which is of a type, such as a high voltage metal bead-chain detector, which is suitable for detecting the presence of an insulation fault or defect in an insulated wire when the wire passes through the detector at relatively high speeds, e.g. 1500 to 5,000 feet per minute. The detector controller 12 is also coupled to a second or locate fault detector 15, the function of which is to specifically locate the area of the insulation fault. A third but optional fault detector 16 may also be coupled to the detector controller 12. This optional fault detector 16 may be utilized for determining the presence of bare wire. Various repair stations including a plastisol applicator station 17, a die spreader 18, a heat lamp 19 and an air cooler 20, are coupled to the process controller 11 which activates each of the aforesaid repair stations at the proper time in response to signals from the counter/comparator 10. The counter/comparator 10 is coupled to and activated by the encoder 9 which controls the length of wire moved through the encoder 9 after locating the exact position of the fault to be repaired at the locate detector 15. The motor controller 13 controls the direction of the motor 6 (forward or reverse) and in turn, the direction and progress of the wire 7 through the machine 1. The motor controller 13 also sends a stop signal at the proper time interval to the motor 6. The motor controller 13 is controlled by outputs from the process controller 11. The speed at which the wire passes through the machine 1 is further controlled by the motor controller 13 and clutch/brake mechanisms 4 and 5. Also, preferably included is a wire tension control means 21.

In operation, a reel of wire 7 to be detected for faults is placed at the supply reel position and the wire is threaded through the machine 1 to the take-up reel 3. The machine 1 is turned on which causes the wire to proceed in a forward direction onto the take-up reel 3 at relatively fast speeds of, for example, 1,500 to 3,000 feet per minute. During this time interval the first fault detector 14 is activated such that when a fault passes through the fault detector 14 a current surge is produced in the fault detector 14 which sends a signal to the detector controller 12 which in turn signals the process controller 11 of the presence of a fault. The process controller 11 causes the wire to stop by activating both brakes and disengaging both clutches of the clutch/brake mechanisms 4 and 5. At the same time the process controller 11 signals the motor controller 13 to disconnect the voltage to the drive motor 6. Due to the high speed of the wire and the time interval taken to bring the wire to a stop, the fault in the wire passes through the machine at some unknown speed and undefined distance from the first fault detector 14. After the wire has stopped, the process controller 11 signals the motor controller 13 and motor and clutch and brake mechanisms such that the wire 7 is caused to proceed in a reverse direction at slow speeds of, for example, 25 to 30 feet per minute and at the same time, activates the locate fault detector 15 and an optional bare wire detector 22 (alternatively the locate fault detector may be kept in an active on condition). When the fault reaches the locate fault detector 15, the detector 15 senses the fault by virtue of a current surge and sends a signal to the detector controller 12 which in turn sends a signal to the process controller 11 to stop the machine. Since the machine was proceeding relatively slowly the machine may be stopped rapidly at this point so that the area of the fault is specifically located in the locate detector 15. At this time the process controller 11 activates the encoder 9 which engages the wire and the wire is then caused to move slowly through the machine with the encoder 9 engaged. The encoder sends pulses at regular intervals to the counter/comparator 10 which in this instance, contains four counters. The encoder 9 emits 250 counts per revolution. Each revolution of the encoder is equivalent to a specific distance of wire traveled after leaving the locate detector. When the number of counts stored in the first counter of the counter/comparator 10 is reached, the fault is under the first repair station, namely the plastisol applicator 17. At this time the process controller 11 receives a pulse from the counter/comparator 10 and the output from the process controller 11 stops the machine and activates the first repair station, namely, the plastisol applicator 17. After a fixed time interval, during which interval plastisol (preferably a PVC plastisol) is applied to the wire over the region of the fault, the wire is again advanced at slow speeds through the machine. At the time the number of counts of the second counter of the counter/comparator 10 is reached, the fault in the wire 7 is just about to enter the die spreader 18 which is caused to close upon a matching of the second number of counts by virtue of a pulse sent from the counter/comparator 10 to the process controller 11 which in turn signals the die spreader 18. The wire 7 continues slowly through the die spreader 18 which operates to spread the plastisol evenly over the wire 7 in the region of the fault to be repaired. The wire 7 continues through the die spreader 18 at which time the number of counts in the third counter of the counter/comparator 10 is matched and the die 18 is caused to be opened. The count interval between the second and third counters of the counter/comparator 10 determines the length of the plastisol coating applied to the wire 7. When the encoder 9 has reached the number of counts that matches the counts stored in the fourth counter of the counter/comparator 10 the wire is caused to be stopped by the process controller 11 by virtue of a signal from the counter/comparator 10 to the process controller 11 and thence from the process controller 11 to the motor and clutch/brake mechanisms 4 and 5. At this time the wire 7 is located under the heat lamp 19 where it remains for a specified time interval, e.g., 20 seconds, which is controlled by the process controller 11. After this specified time interval the process controller 11 causes the heat lamp to be shut off and a cool air stream 20 to be passed over the wire to cool it for another specified time interval. Thereafter, the process controller causes the wire to again move through the machine at its normal fast speed of 1,500 to 3,000 feet per minute. Optionally, a fault detector 22 of the same type as the first fault detector 14 may be placed in the line after the cool air stream 20 for detecting the quality of the repair.

While FIG. 1 depicts the position of the various repair stations as being to the right of the first fault detector 14, that is, upstream of the normal flow of the wire through the apparatus, the position of the repair stations may be inverted and the counter/comparator and process controller appropriately adjusted so that subsequent to repair of the fault, the wire again passes through the first detector which can measure the integrity of the repair without the need for an additional fault detector for that purpose. Such a configuration would also allow for the detection and repair of faults which are of fairly close proximity with one another. It would of course also be obvious to one skilled in the art that the cooling means provided after the heat curing step in the repair of the wire may be something other than air cooling and also that other devices which served to control the speeds of the reels may be substituted for the particular clutch/brake mechanisms set forth herein. Furthermore, one may use two motors, one for each reel rather than a single motor as depicted. Additionally, as is well known in the art, one may include any conventionally available mechanism for detecting and alleviating slack in the wire during its progress through the machine.

Figure 2:
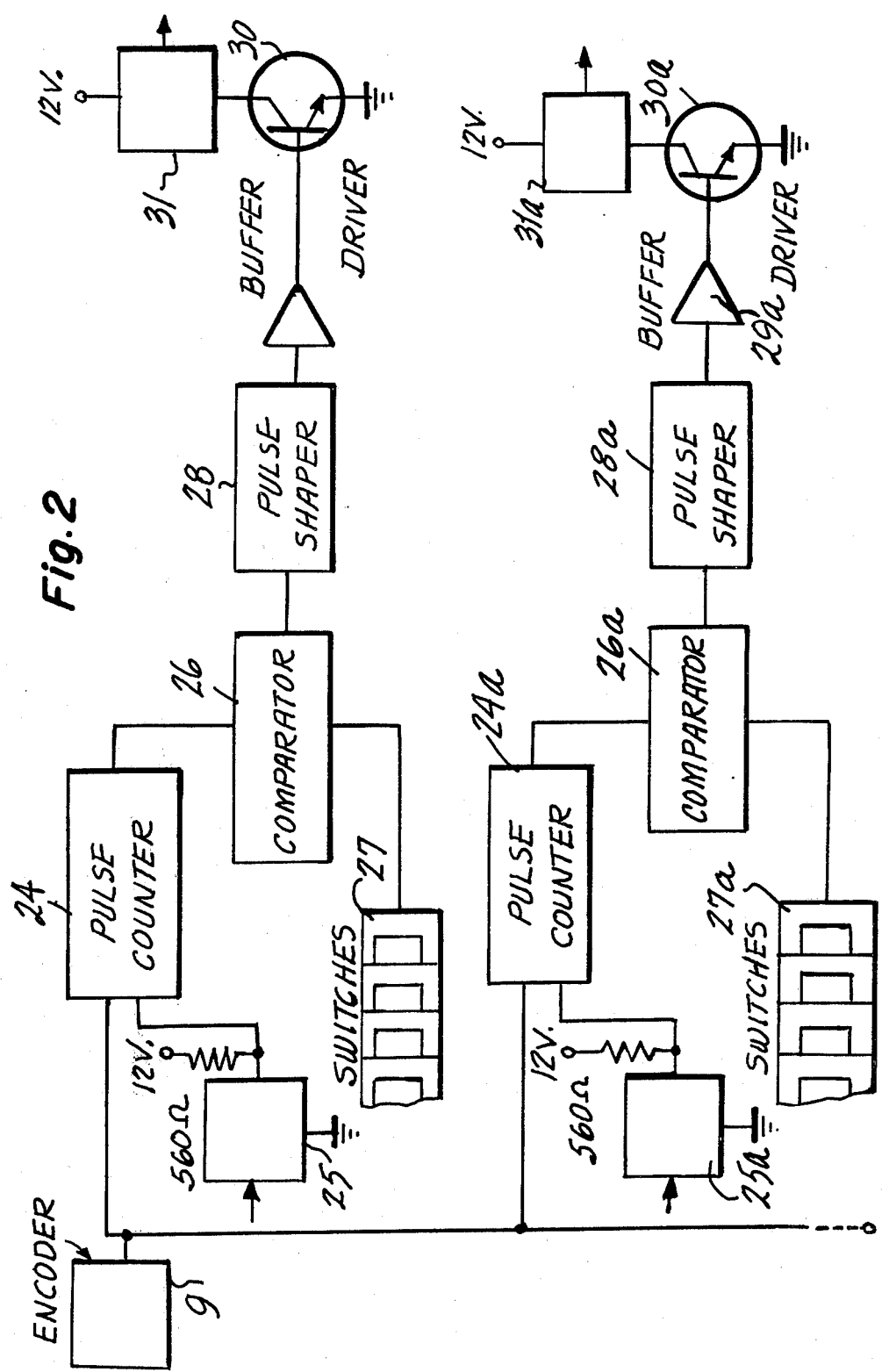
FIG. 2 is a block diagram of the counter/comparator circuit used in the novel apparatus.

FIGS. 2 and 3a-c depict the counter/comparator circuits for the novel apparatus. It is the counter/comparator circuit which both receives inputs from the process controller and provides inputs to the process controller for ultimately detecting and controlling the position of the wire and for the operation of the various repair devices as the wire proceeds through the apparatus. FIG. 2 is a block diagram showing the basic components of the counter/comparator circuit and their interconnections. As can be seen from this FIG. an output from the encoder 9 provides an input to each of the pulse counters 24, 24a, etc. of the circuit. A second input is provided to each pulse counter, respectively, via a driver 25, 25a, etc. which is coupled to an output from the process controller. A 12 volt bias is provided across this output. The output of the respective pulse counters provides an input to the respective comparator circuits 26, 26a, etc. Second inputs to each comparator circuit are provided by thumbwheel switches 27, 27a, etc., respectively. When the output of the pulse counter 24 into the comparator 26 is equal to the preselected input to the comparator 26 from the switches 27, the comparator 26 will emit a pulse to the respective pulse shaper 28, 28a, etc. This in turn provides a signal to a buffer and driver circuit 29 having an output which provides an input back to the process controller 11. The process controller 11 then provides appropriate signals to the remainder of the circuit elements to control the speed and movement of the wire 7 and the operation of the respective repair stations.

Figure 3A:
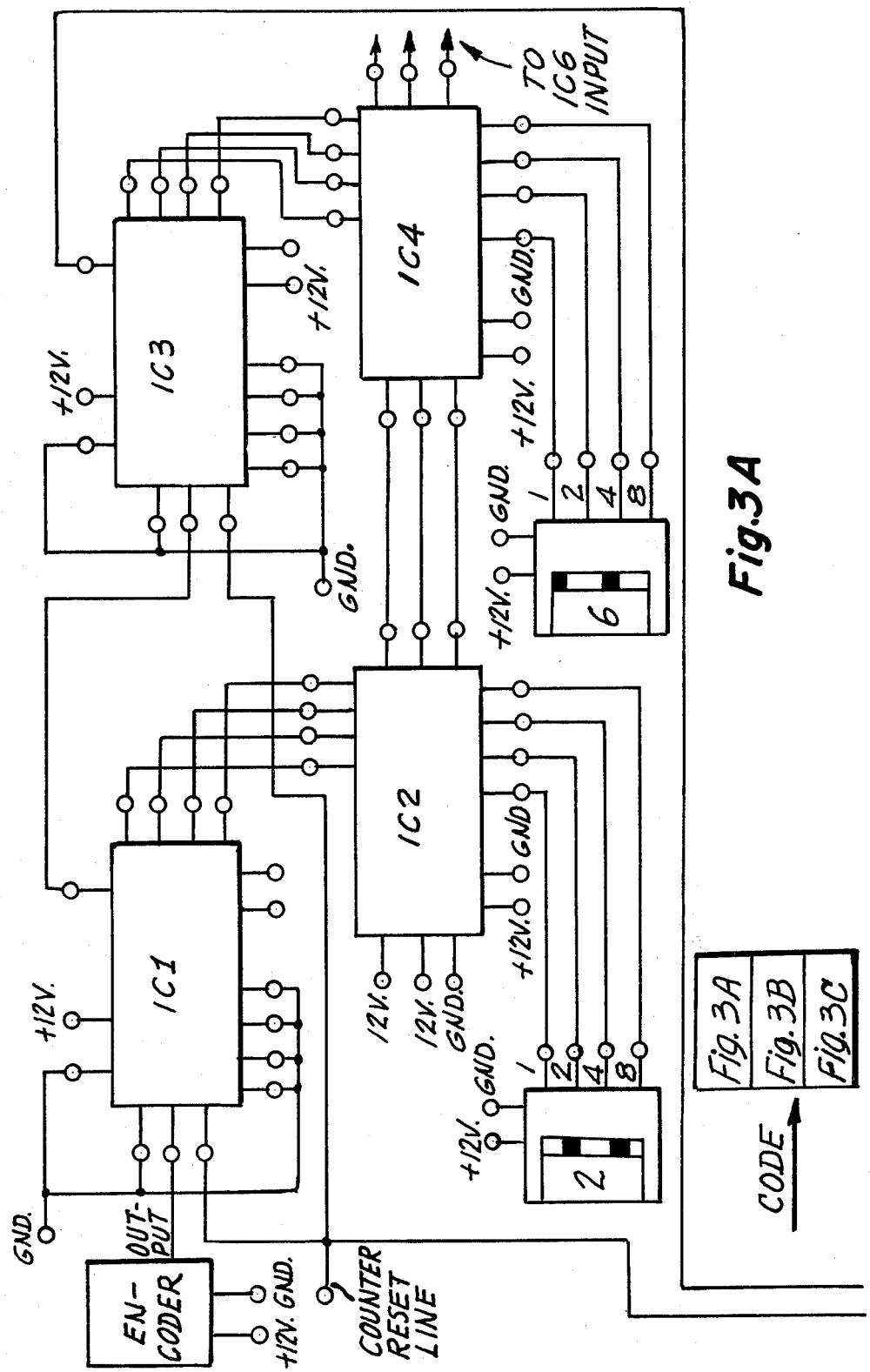
FIGS. 3a and 3c are more detailed diagrams of the counter/comparator circuit.
Figure 3B:
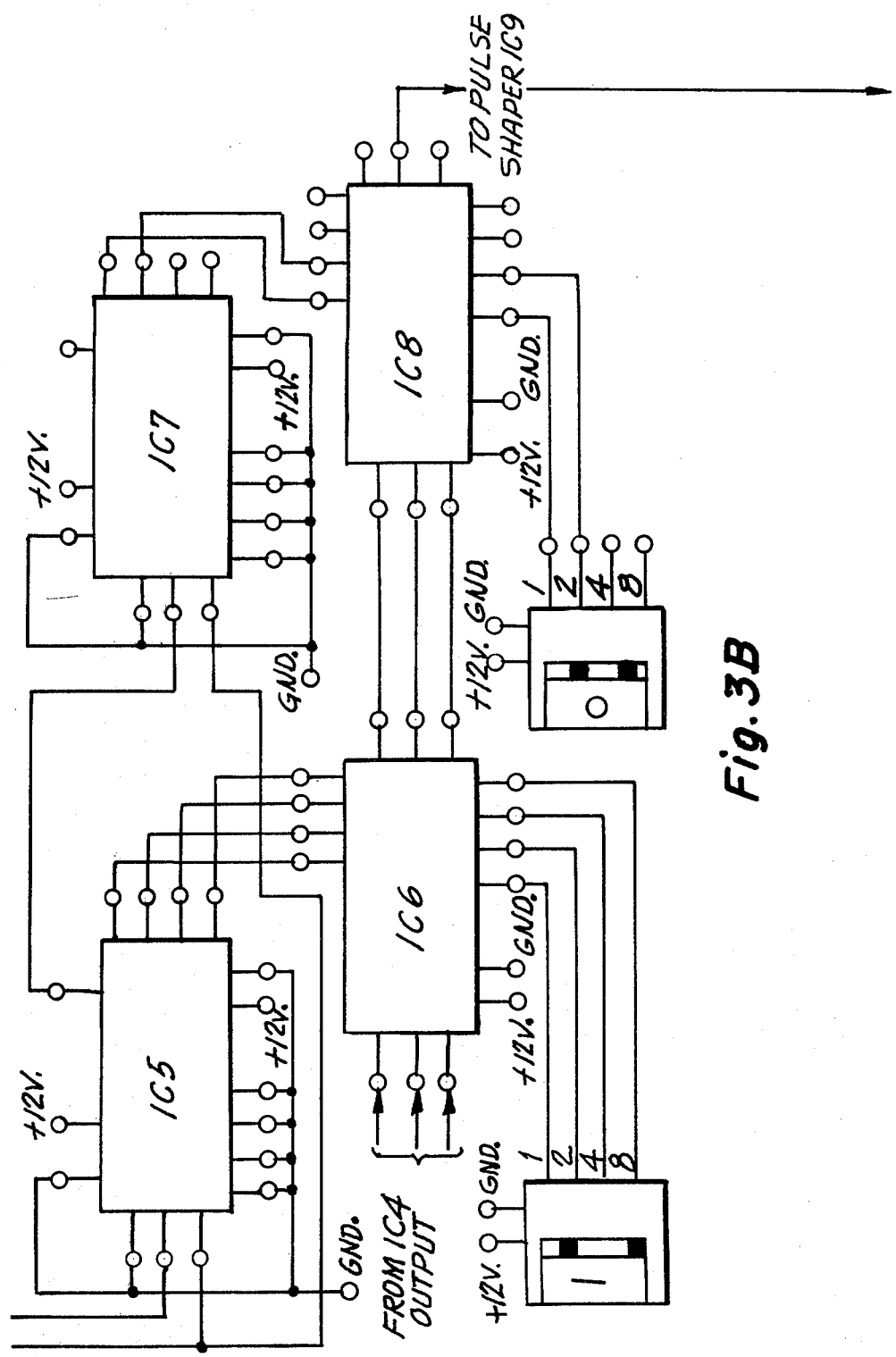
Figure 3C:
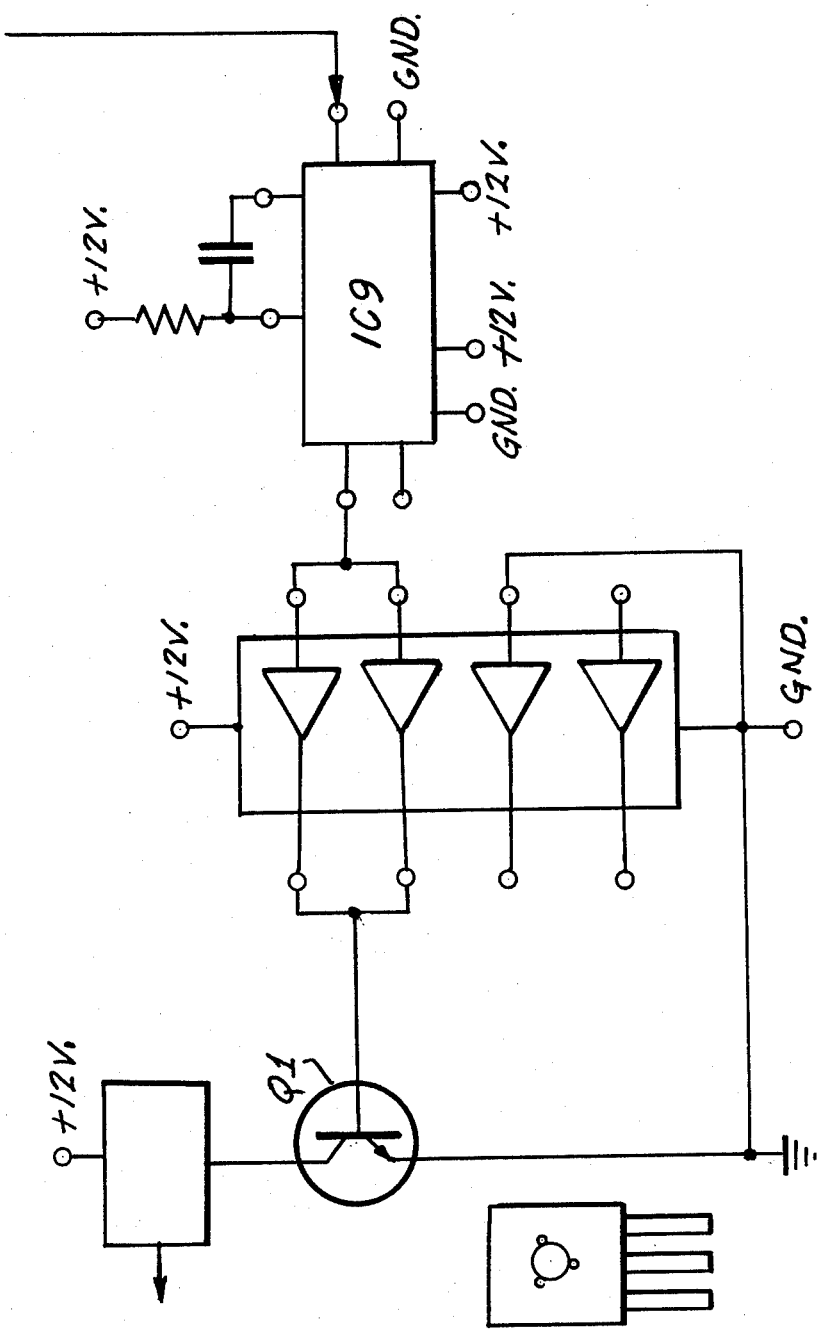

In FIG. 3 there is a more detailed diagram of one portion of a typical pulse counter/comparator/pulse shaper and buffer-driver circuit. As can be seen, each comparator represented by the block diagram is actually four integrated circuit chips, IC 2, IC 4, IC 6 and IC 8. A suitable integrated circuit chip for the comparator is a commercially available MC14585 from Motorola. Each pair of pulse counter chips and comparator chips, for example, IC 1 and IC 2, or IC 3 and IC 4, or IC 5 and IC 6, etc., represents a different decimal digit. Similarly each pair is coupled to one of the four digital output thumbwheel switches which sets the level of the respective comparator to which it is coupled. The first counter/comparator chips, that is IC 1 and IC 2, represent the ones digit as far as pulse counting of output pulses from the encoder is concerned, while the other sets represent the tens, hundreds and thousands digits, respectively. For every ten pulses collected in IC 1 one pulse is transmitted from IC 1 to the clock input of the counter of IC 3. Similarly, for every ten pulses to IC 3 one pulse is provided to the counter input of IC 5 and again for every ten pulses in IC 5 one pulse is provided to the counter input of IC 7. Consequently, IC 1 counts the unit's digits while IC 3 counts the tens, IC 5 the hundreds and IC 7 the thousands digits. When the number of pulses in IC 1 is equal to the preset number of pulses from the digital switch coupled to IC 2, there is an output from IC 2 into an input of IC 4 providing the necessary bias on IC 4. IC 4 may then be considered to be activated such that it too can emit a pulse to IC 6 when the number of counts in IC 3 matches the number of counts set by the thumbwheel switch connected to IC 4 and so on. In this manner it prescribes the number of counts equivalent to a specific distance of movement of the wire. The pulse counter/comparator for each repair station provides an output into the respective pulse shaper/driver circuit as shown in FIG. 3c, the output of which provides an input into the process controller.

In operation of the machine, once a fault has been located and positioned at a known point, the encoder is caused to engage the wire by means of a knurled wheel of the encoder. The wire is then moved in the direction of the repair station. The wheel of the encoder is caused to turn by movement of the wire over it. The wheel is connected to the encoder shaft which produces pulses from the output of the encoder proportional to the movement of the wire. The pulses are transmitted to the electronic counter circuits in serial form and output from the counter in binary code decimal form. These binary levels are sent to a set of inputs of a comparator which may be termed Group A inputs. These inputs are compared in the comparator to another set of inputs of the comparator called Group B inputs. The Group B set of inputs to the comparator comes from the set of four thumbwheel switches which also have a binary code decimal output which matches a digital number on the switch base. The thumbwheel switches are used to set a predetermined number in the comparator circuit which is equal to the desired number of pulses that will come from the counter with the binary coded decimal outputs. This, of course, is equal to a predetermined movement of the wire so as to place the wire over or under a given repair station. When the two groups of binary code decimal counts in the comparator are equal at their respective inputs, the comparator will give an output pulse. This pulse is then conditioned by means of the pulse shaper and buffer so it will drive the input to the process controller. There are four sets of counter/comparator circuits which are responsive to the encoder. The first one stops the wire at a point under the plastisol dispenser nozzle and activates the dispenser. The second counter circuit closes the wiping die so that the plastisol is wiped uniformly over the fault in the insulated wire. The third counter/comparator circuit opens the wiping die. The last counter/comparator circuit causes the repaired fault to stop in the center of the radiant heat lamp which is then caused to be turned on in order to cure the plastisol. It also activates the cooling air blast as the wire exits the heat lamp. Additional switch and counter/comparator circuits for controlling movement of the wire to and through other optional stations, e.g., the bare wire detector and/or the fault repair test detector may be provided.

Figure 4:
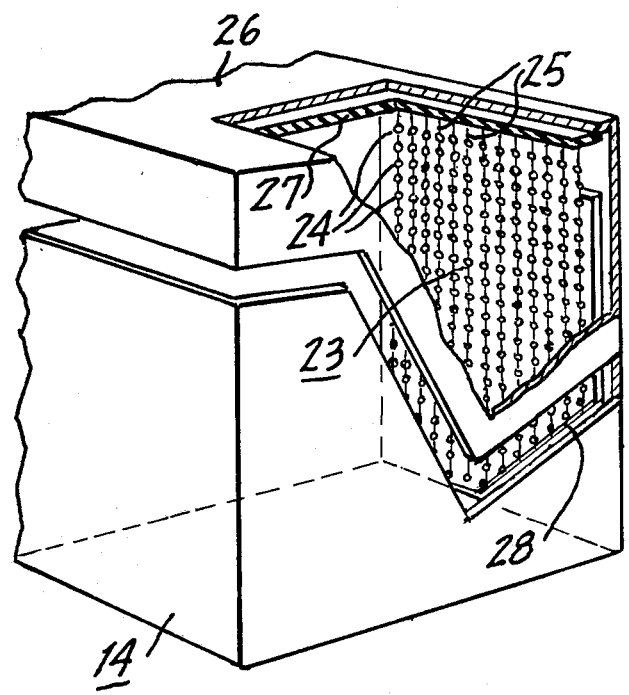
FIG. 4 is an elevational cutaway side view of a bead-chain detector.

In FIG. 4 there is shown an elevational cutaway view of the first fault detector 14. This detector is a bead-chain type high voltage detector. The principle behind the detection of insulation faults in insulated wire with the bead-chain detector as well as the other detectors is to cause a current surge at the point of the fault and detect this current. In order to do this the conductor in the wire is maintained at ground potential while the wire travels through the detector which is held at approximately 3,000 volts DC potential. If a fault exists in the wire insulation a path for electrical conduction exists at the point of the fault. The circuitry in the detector is such that any current flow from the high voltage detector 14 is interpreted as a fault. In order to accomplish this the detector 14 must make physical contact or at least be close enough to the wire so that the high voltage can break down the air gap between the detector and the ground wire in the region of the insulation fault. In the bead-chain detector 14 the wire passes through a three-dimensional curtain of metal beads 23. The beads themselves 24 are approximately ⅛ inch in diameter on approximately 3/16 inch centers and are connected by a 1/32 inch diameter metal chain 25. Typically, the length of the detector along the axis of movement of the wire is about 6 inches while the height and width of the detector is aproximately 3 inches by 2 inches. A multiplicity of these bead chains are extended from a metal housing 26 of the detector on centers of aproximately ⅛ of a inch. Each bead chain is held on a metal bracket 27 near the top of the housing. Another metal bracket 28 extends downwardly to the bottom of the bead chains and at the bottom, has a V-shape such that the wire passes through the detector near the bottom of the V-shape bracket with the beads laying in the V-shape trough formed by the bracket. Ideally, the wire will pass through the detector making slight contact with the bottom of the V-shape trough formed by the bracket. The top portion of the wire will make contact with the metal beads. The metal bracket is held at 3,000 volts above ground and hence the beads which are connected thereto by conductive means are similarly charged.

Figure 5:
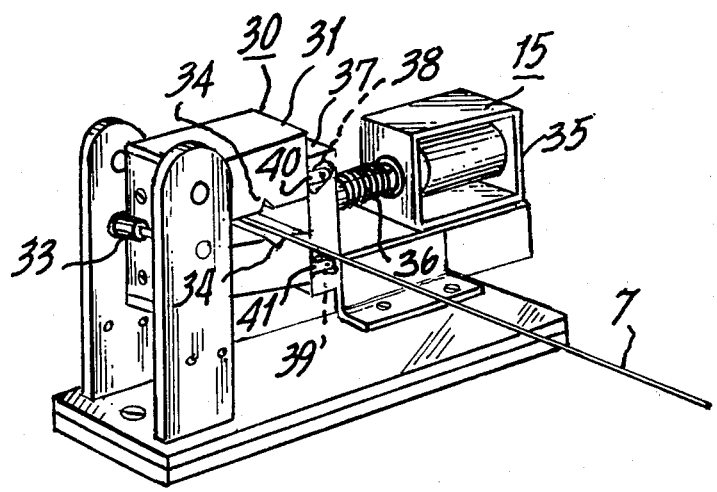
FIG. 5 is an elevational view of the second or locator detector used in the apparatus.

FIG. 5 is an elevational view of the locating detector 15 used in the aforementioned apparatus. In the automatic repair of wire it is essential that the fault to be repaired be located and positioned relatively precisely. Knowing the location of the fault within plus and minus ½ inch is required. Due to the speed of the wire 7 and the width of the bead-chain detector 14 and the nature of the bead-chain detector 14, it has been determined that a fault could easily travel through 2 to 4 inches of the detector 14 before being detected and then, due to the inertia of the reels and the high speed of the wire, the wire could not be immediately stopped after detection thus making accurate positioning of the fault impossible by the first fault detector 14. To alleviate this problem the locating detector 15 was developed. The principle on which the locating detector works is the same as the first detector 14, namely, the detection of a current surge at the point of a fault when applying a high voltage between the wire held at ground and the detector 15. The locating detector 15 consists of a block of solid copper 30 typically about 1 inch long (along the axis of the wire) by 2½ inches wide and 2½ inches high. The block is split to form two hinged halves 31 and 32, each half measuring 1 inch by 1¼ inches by 1¼ inches and connected by means of an hinge 33. Through the one inch dimension is a small hole 34 extending through both halves of the block. The hole 34 is of such size that the wire 7 to be tested will just fit, with slight rubbing when passing therethrough. The block is charged to 3,000 volts DC. When not in use, the halves of the hinged block 30 are opened up to provide free passage of the wire 7 through the block 30. Opening and closing of the block 30 is accomplished via a solenoid 35 coupled to the process controller 11. Activation of the solenoid causes the central spring loaded core 36 of the solenoid 35 to retract from its normal position pulling a slotted insulating block 37 along with it. The slots 38 and 39 in the insulator block 37 engage ears 40 and 41 which extend from the conductor halves 31 and 32, respectively. The solts 38 and 39 are slanted in such a way that horizontal movement of the insulator block 37 causes the split conductor block 30 to close upon retraction of the solenoid core 36 and to remain open when the core, 36 is in its normal position, i.e., when the solenoid 35 is not activated.

Figure 6:
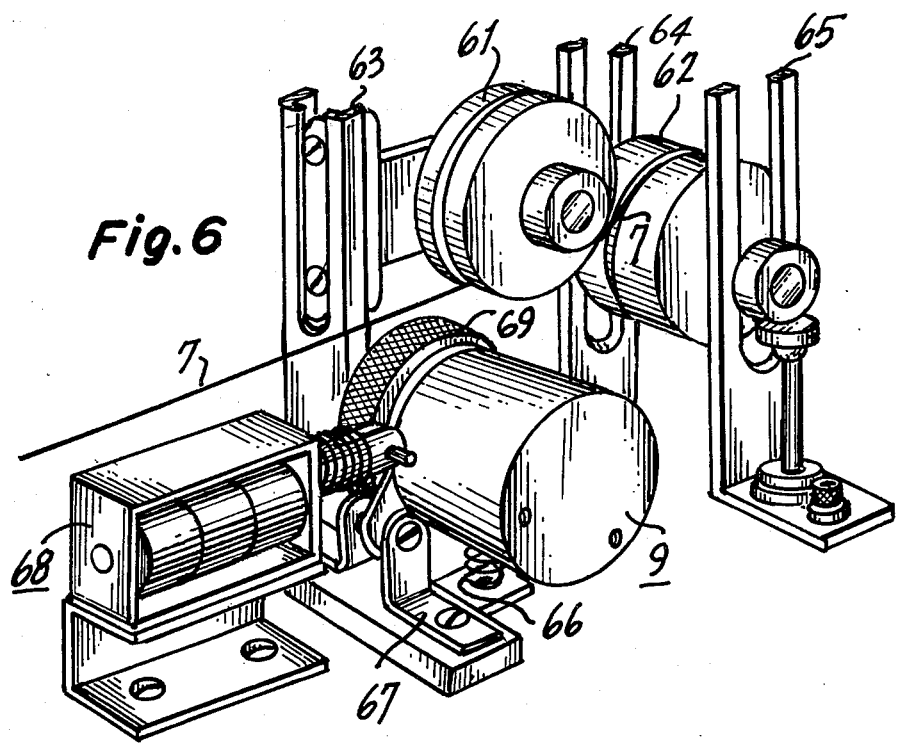
FIG. 6 is an elevational view of the encoder used in the apparatus.

FIG. 6 is an elevational view of the encoder. This FIG. shows the insulated wire 7 passing by the encoder 9 when the encoder 9 is not engaging the wire 7. The wire 7 which travels from left to right is shown to pass through two guide rollers 61 and 62 which are held in place by various support structures 63, 64 and 65. The encoder 9 is biased upwardly by a compression spring 66 mounted below the encoder 9 and is pivotally mounted on a housing 67. The spring bias is counteracted by a spring loaded solenoid 68 which pushes the encoder downward, compressing the spring 66 and disengaging the encoder from the wire 7. When the encoder 9 is to engage the wire 7, the solenoid 68 is activated, retracting the solenoid core and causing the encoder 9 to be raised by the spring 66 so as to engage the wire at the knurled wheel portion 69 of the encoder 9. Once engaged, movement of the wire causes rotation of the knurled wheel 69 of the encoder 9 in proportion to the length of wire 7 moving past the encoder 9. This then causes output pulses from the encoder to the counter/comparator circuit. The number of pulses designates a particular length of wire 7 passing the encoder 9.

Figure 7:
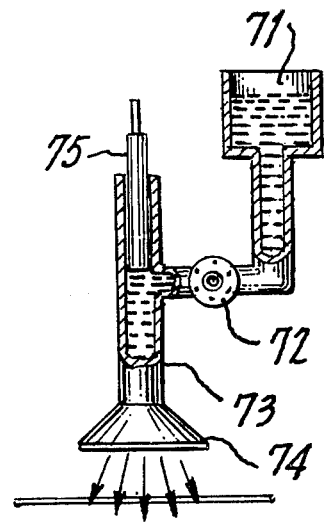
FIG. 7 is an illustration of a plastisol dispenser useful in the novel apparatus.

Referring to FIG. 7, there is shown an elevational, partially cross-sectional view of the plastisol dispenser or applicator 17. The applicator 17 comprises a plastisol reservoir 71 which leads to a metered solenoid or other electrically controlled valve 72, the plastisol which is allowed to pass through the valve 72 at the proper time enters a syringe-like portion of the applicator consisting of a cartridge or cylinder 73 having a flared nozzle 74 at one end and a plunger 75 inserted into its other end. Activation of the plunger 75 causes the plastisol in the cylinder 73 to be forced out of the nozzle 74 and onto the wire 7 therebelow. The plunger 75 is activated by a solenoid (not shown) which is controlled by the process controller 11.

Figure 8:
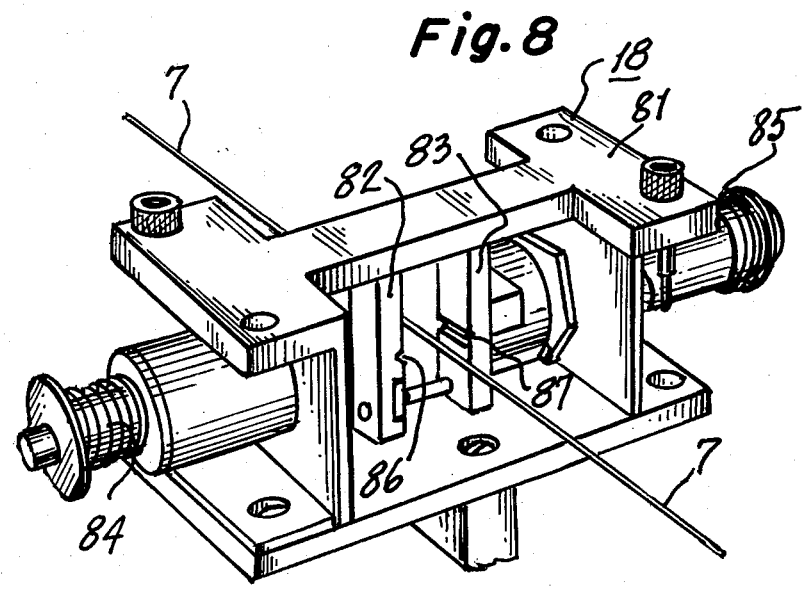
FIG. 8 is an elevational view of the spreader used in the novel apparatus.

FIG. 8 is an elevational view of the die or plastisol spreader 18 in its open or disengaged position. The spreader 18 consists of a frame 81 which holds two horizontally movable dies 82 and 83. Movement of the dies 82 and 83 are controlled by a pair of oppositely forcing solenoids 84 and 85, respectively. Activation of the solenoids 84 and 85 causes the dies 82 and 83 to come together. The wire, having plastisol thereon, fits into the oppositely positioned and tapered grooves 86 and 87 in the dies 82 and 83, respectively. Passage of the wire 7 with plastisol thereon through the closed die members causes spreading of the plastisol over the wire 7 to form a uniform plastisol coat in the area of the insulation fault.

Typically the plastisol dispenser dispenses about 0.2 to 2.0 cc. of plastisol to coat the fault. The time required to cure the plastisol with the heat lamp used is about 20 seconds. The particular plastisol, when cured should be abrasion resistant, flame retardant and have a high breakdown voltage. A suitable plastisol has the following formula:

(1) Goodyear WO1 PVC Dispersion Resin: 70 phr
(2) Goodrich 140X30 PVC Blending Resin: 30 phr
(3) Santicizer 711 plasticizer: 67 phr
(4) NL Dythal Stabilizer: 7 phr
(5) $Sb_2O_3$: 4 phr It should be understood that the particular repair coating will depend upon the type of insulation being repaired and this invention is not limited to any specific type of repair coating.

It should be understood by one skilled in the art that the particular components used by applicants can be replaced by any other suitable substitutes. For example, any reversible motor capable of being driven at the desired speeds under the operating load condition is suitable. Similarly, clutch/brake mechanisms are standardly available components as are process controllers, counter circuits and electronic controllers. For example, a suitable process controller is a Texas Instruments 5TI-102 microprocessor programmable control system; a suitable motor and motor controller is a 2 H.P. Hampton Products DC motor and a Cycletrol 240 controller respectively; a suitable fault detector controller is a Hipotronics 420-5N DC sparker. Similarly, a Warner tension control system and a Tridak 280-J dispenser system may be employed to maintain wire tension control and plastisol application, respectively.

What is claimed is:

1. A machine for detecting and repairing faults in the insulation of insulated wire comprises:
   a wire supply reel and a wire take-up reel spaced therefrom;
   means for conveying the wire through the machine from the supply reel to the take-up reel;
   a first fault detector through which the wire passes for sensing the presence of a fault;
   a second fault detector, spaced from the first fault detector for specifically locating a detected fault in the insulation;
   a sequence of spaced fault repair means serially activated after location of the fault and located at fixed distances from the second fault detector said repair means including means for applying a curable repair coating over the fault and means for curing the coating;
   control means responsive to the detection of a fault for causing the wire to stop and controlling the direction and speed of movement of the wire as it progresses through the machine; and
   process control means for automatically activating and deactivating the control means and the respective sequential repair means at predetermined distances of movement from the second fault detector of the insulated wire to be repaired.

2. The machine recited in claim 1 wherein said curable repair coating is a plastisol and including means for spreading the plastisol uniformly around the area of the insulation fault and means for cooling the cured plastisol.

3. The machine recited in claim 2 including repair quality detection means.

4. The machine recited in claim 1 wherein the first and second fault detection means are high voltage spark detectors.

5. The machine recited in claim 1 wherein the process control means comprises a process controller and a counter/comparator circuit.

6. The machine recited in claim 1 including an encoder having a wheel portion which is engaged by the wire to be repaired, said encoder having a pulsed output, the number of pulses being proportional to the length of wire passing over the encoder wheel, said output providing an input to the counter means of the counter/comparator circuit.

7. The machine recited in claim 1 including means for detecting the quality of the repair.

8. The machine recited in claim 1 wherein said curable repair coating is a plastisol compatible with the insulation to be repaired.

9. The machine recited in claim 1 wherein said first and second detector means are high voltage spark detectors.

10. A machine for automatically detecting and repairing faults in the insulation of insulated wire comprises:
    a wire feed means and a wire take-up reel;
    a motor having at least two speeds coupled to the take-up reel;
    a clutch/brake mechanism coupled to the wire feed means for aiding in the control of the speed of the wire through the machine;
    a first high voltage fault detector for detecting the presence of an insulation fault while the wire is moving at a high speed;
    a second high voltage fault detector spaced from the first fault detector for specifically locating the fault detected by the first fault detector when the wire is moving at a slow speed;
    a sequence of spaced fault repair means serially activated after location of the fault by an electronic control circuit and located at fixed distances from said second fault detector, said repair means including means for applying a curable plastisol repair coating over the area of the fault, means for uniformly spreading the applied coating, means for heating the coating so as to cure it and means for cooling the cured coating; and
    wherein the electronic control circuit comprises a detector control circuit, a motor control circuit, a counter/comparator circuit, an encoder and a process controller, the fault detectors being coupled to the detector circuit which upon detection of or location of a fault provides an input signal to the process controller, the encoder is coupled to the wire so as to detect movement of the wire and provide a pulsed signal to the counter/comparator circuit, the number of pulses being proportional to the distance of wire moved over the encoder, the output of the encoder provides input signals to the process controller equivalent to preselected distances of movement of the wire, the output of the process controller is coupled both to the motor control circuit, which in turn controls the motor and clutch/brake mechanism for stopping, starting and speed control of the wire and to the repair means which are serially activated at the appropriate times.

11. A method for detecting and repairing insulation faults in insulated wire comprises:
    (a) passing the wire at relatively high speeds through a first fault detector for sensing the presence of a fault in a general area of the wire and signaling an electronic control network of the detection of the fault;
    (b) upon the sensing of a fault, the electronic network causing the wire to pass at slow speeds through a second fault detector for specifically locating the fault;
    (c) sequentially moving the wire at slow speeds for fixed distances from the second fault detector in response to a signal from the electronic control network such that the fault is sequentially juxtaposed to a series of fault repair stations;
    (d) repairing the fault by applying a curable fault repair coating over the fault at one repair station and curing the coating at another repair station; and
    (e) subsequent to fault repair, resuming the high speed of the wire until the first fault detector again senses a fault whereupon the process is repeated.

12. The method recited in claim 11 including the step of testing the integrity of the repair by passing the repaired area through a fault detector.

13. The method recited in claim 11 wherein the curable fault repair coating is a plastisol which is compatible with and adherent to the insulation to be repaired.

14. The method recited in claim 11 wherein the electronic control network includes a detector circuit, a motor control circuit, a counter/comparator circuit, an encoder and a programmable process control circuit.

15. The method recited in claim 14 including the steps of providing output signals from the fault detectors to the detector circuit in response to the detection of a fault, providing outputs from the detector circuit and the counter/comparator circuit to the process control circuit and in response thereto, from the process control circuit to the motor control circuit and repair stations for controlling the direction and speed of the wire and the sequential operation of the repair stations.

16. A method for detecting and repairing insulation faults in insulated wire comprises:
(a) passing the wire at relatively high speeds through a first fault detector for sensing the presence of a fault in the insulation;
(b) providing a signal from the first fault detector upon sensing of a fault to cause the wire to stop and then reverse its direction at slow speeds and to activate a second fault detector;
(c) locating the specific point of the fault by means of the second fault detector;
(d) engaging an encoder with the wire for detecting the length of wire moving at slow speed past the encoder after location of the fault; the encoder providing output pulses proportional to the movement of the wire;
(e) providing output signals from a counter/comparator circuit which is coupled to the output of the encoder to sequentially locate the fault in juxtaposition to fault repair stations; and
(f) providing output signals from a process control circuit in response to inputs signals thereto from the counter/comparator to sequentially activate the appropriate repair station when the fault is in juxtaposition thereto, said repair stations including a plastisol applicator, a spreader, a heater for curing the plastisol and cooling means.

* * * * *